(12) United States Patent
Babitch et al.

(10) Patent No.: US 8,699,977 B2
(45) Date of Patent: Apr. 15, 2014

(54) RECEIVER WITH OVERLOADING PROTECTION/PREVENTION

(75) Inventors: Daniel Babitch, San Jose, CA (US); Joakim Landmark, Phoenix, AZ (US); Behzad Sheikholeslami, Cambridge (GB); Peter Topham, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/423,648

(22) Filed: Mar. 19, 2012

(65) Prior Publication Data

US 2012/0243640 A1   Sep. 27, 2012

(30) Foreign Application Priority Data

Mar. 22, 2011   (GB) .................................. 1104742.0

(51) Int. Cl.
*H04B 1/18*   (2006.01)

(52) U.S. Cl.
USPC ....................................... 455/150.1; 455/266

(58) Field of Classification Search
USPC .................. 455/130, 150.1, 266, 340, 341
See application file for complete search history.

(56) References Cited

U.S. PATENT DOCUMENTS

| | | | | |
|---|---|---|---|---|
| 6,903,606 B1 * | 6/2005 | Yan et al. | ............................ | 330/9 |
| 7,715,813 B2 * | 5/2010 | Heng | ......................... | 455/150.1 |
| 8,145,172 B2 * | 3/2012 | Khoini-Poorfard et al. | .. | 455/266 |
| 8,301,091 B2 * | 10/2012 | Vice et al. | ................... | 455/127.3 |
| 2012/0202445 A1 * | 8/2012 | Manetakis | ..................... | 455/341 |

\* cited by examiner

*Primary Examiner* — Sonny Trinh
(74) *Attorney, Agent, or Firm* — RatnerPrestia

(57) ABSTRACT

A receiver including: an antenna for receiving signals in a plurality of frequency ranges; a plurality of amplifiers, each of the plurality of amplifiers being configured to amplify signals in one of the plurality of frequency ranges; a plurality of receive paths, each of the plurality of receive paths connecting an output of the antenna to an input of one of the plurality of amplifiers, wherein each of the plurality of receive paths includes a power detector for monitoring signal power in the receive path and a switch which can be operated to activate or deactivate the receive path, wherein the switch of each receive path is operable to deactivate the receive path if an overload condition is detected by the power detector of that receive path.

17 Claims, 4 Drawing Sheets

US 8,699,977 B2

RECEIVER WITH OVERLOADING PROTECTION/PREVENTION

CROSS REFERENCE TO RELATED APPLICATIONS

This application claims priority to GB Application No. 1104742.0, filed Mar. 22, 2011, entitled A RECEIVER, the contents of which are incorporated herein by reference.

TECHNICAL FIELD

The present invention relates to a receiver, and in particular to a receiver which is capable of receiving signals in a plurality of different frequency bands.

BACKGROUND TO THE INVENTION

Navigation and location-based services receivers which are configured to receive navigation service signals such as those from the GPLS, GLONASS, Galileo or Compass systems can benefit from the assistance of signals of opportunity, in which information derived from the signal of opportunity is used for example for location aiding, frequency aiding and time aiding by the location based service receiver. Examples of signals of opportunity which may be used by a location-based service receiver include GSM850, GSM900, GSM1800 and GSM1900, which use the standardised 850 MHz, 900 MHz, 1800 MHz and 1900 MHz frequency bands respectively, and WiFi, which uses the standardised 2.4 GHz frequency band.

Receiving signals of opportunity is facilitated by multi-band radio receivers, that is to say radio receivers that are capable of receiving signals in two or more frequency ranges. Multi-band radio receivers often require filters to reduce the effects of strong out-of-band blocking signals on the performance of the receiver. Such signals may be received, for example, from transmitters in close proximity to the receiver (e.g. a transmitter of a mobile telephone, if the receiver is used in a mobile telephone).

Typically, SAW (surface acoustic wave) filters are used to filter out such blocking signals. A typical receiver architecture having three receive paths, only one of which is operational at any one time, is illustrated schematically in FIG. 1. In the architecture 10 of FIG. 1, a multi-resonant antenna 12 is able to receive signals in three different frequency ranges. The output of the antenna 12 can be connected, via a switch or triplexer 13 to one of three parallel SAW filters 14, 16, 18, which are external to an integrated circuit (chip) in which parallel low noise amplifiers (LNAs) 20, 22, 24 are implemented.

Each of the LNAs 20, 22, 24 is configured to operate in one of the frequency ranges of the antenna 12, and receives at its input the output of a respective one of the SAW filters 14, 16, 18, which are configured to pass signals in the frequency range of interest and to attenuate out-of-band signals strongly.

The outputs of the LNAs 20, 22, 24 are fed to an input of a common buffer 26, via a common output resonator or tank circuit made up of a variable capacitor 28 and an inductor 20 connected in parallel between a supply voltage and the input of the buffer 26. The common output tank circuit can be tuned using the variable capacitor 28 to select its centre frequency.

A problem with architectures such as the one illustrated in FIG. 1 is that the bill of materials (BOM) cost can be high, as it is dominated by components external to the chip, and in particular by the SAW filters 14, 16, 18. The SAW filters 14, 16, 18 can, however, protect the LNAs 20, 22, 24 against extremely large co-located transmit signals because they have very good rejection of nearby frequencies in case the transmit and receive bands are separated in frequency. In such a multi-band receiver, it may be acceptable to receive on a different band at well-separated frequency when transmit is present on a first band, or simply to wait until the transmit signal is no longer present. Thus, it would be desirable to provide a receiver architecture which provides attenuation of out-of-band blocking signals without using costly SAW filters, yet still provide protection against damaging transmit signals.

SUMMARY OF INVENTION

According to a first aspect of the present invention there is provided a receiver comprising: an antenna for receiving signals in a plurality of frequency ranges; a plurality of amplifiers, each of the plurality of amplifiers being configured to amplify signals in one of the plurality of frequency ranges; a plurality of receive paths, each of the plurality of receive paths connecting an output of the antenna to an input of one of the plurality of amplifiers, wherein each of the plurality of receive paths includes a power detector for monitoring signal power in the receive path and a switch which can be operated to activate or deactivate the receive path, wherein the switch of each receive path is operable to deactivate the receive path if an overload condition is detected by the power detector of that receive path.

The present invention provides a multi-band receiver architecture which does not require SAW filters, but which provides protection for the amplifiers in the event of an overload condition.

Each of the plurality of receive paths may include a resonant circuit for filtering signals received at the antenna.

The resonant circuit of each of the plurality of receive paths may contain only one or more inductors and one or more capacitors.

The receiver may further comprise a resonant circuit for filtering the outputs of the amplifiers.

The switch of each of the plurality of receive paths may be biased towards a position in which the receive path is deactivated when a power supply is provided to the switch.

The switch of each of the plurality of receive paths may be provided with a power supply which is always on.

Alternatively, the power detector of each of the plurality of receive paths may have an output which is connected to a power supply input of the switch of that receive path such that if an overload condition is detected by the power detector the switch receives a power supply to cause it to revert to its bias position and deactivate the receive path.

In this case, each of the plurality of receive paths may comprise an impedance to ensure that the switch remains in its bias position and the receive path remains deactivated until the overload condition ceases.

In an alternative embodiment the switch of each of the plurality of receive paths may be biased towards a position in which the receive path is deactivated when no power supply is provided to the switch.

The switch of each of the plurality of receive paths may be operable to deactivate that receive path when that receive path is not in use.

The receiver may further comprise an overload controller which is configured to receive an input from the power detector of each of the plurality of receive paths and to control the operation of the switch of each of the plurality of receive paths according to the inputs received from the power detectors.

The receiver may further comprise means for tuning each of the plurality of receive paths to a desired frequency range.

The means for tuning each of the plurality of receive paths may comprise means for detecting a maximum in a signal received by the receiver and a controller for adjusting the resonant circuit of the receive path to adjust the tuning of the receive path.

The receiver may further comprise a signal source which generates a signal which can be used by the receiver for purposes of tuning adjustment.

The signal may be modulated with BPSK, AM or square wave FM.

The receiver may further comprise means for tuning the resonant circuit for filtering the output of the amplifiers.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Figure 1:
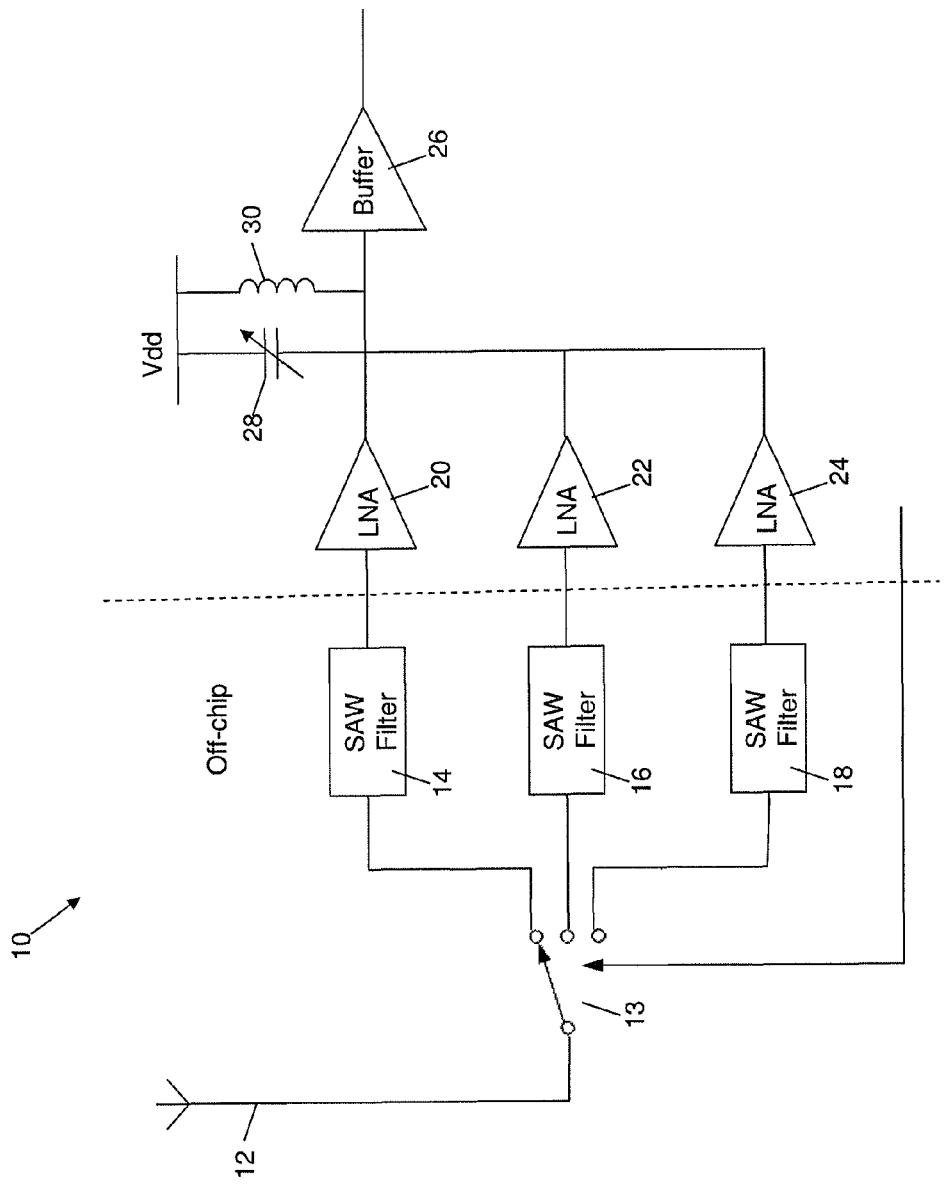
FIG. 1 is a schematic representation of a prior art multi-band receiver architecture which uses external SAW filters to attenuate out of band blocking signals.
Figure 2:
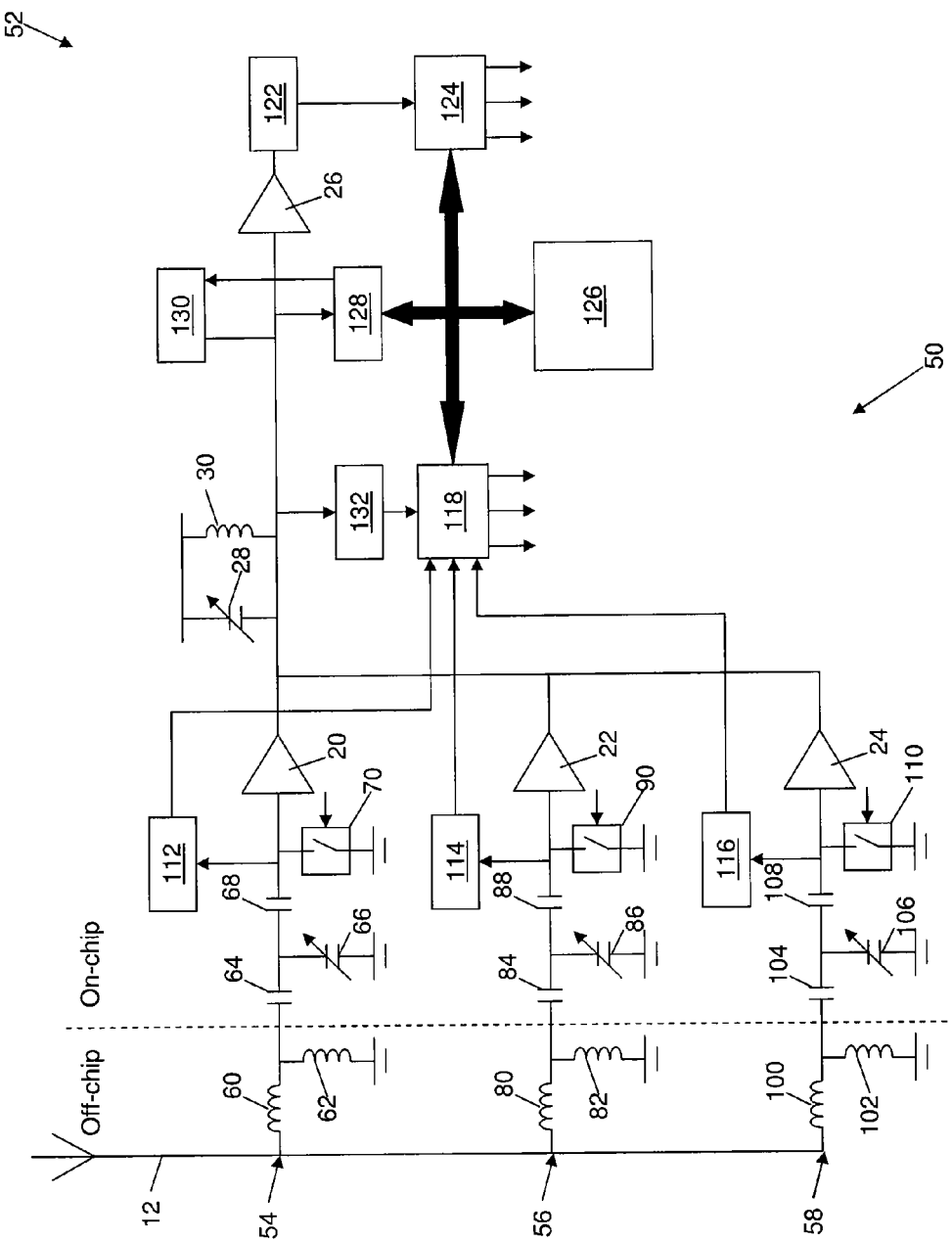
FIG. 2 is a schematic block diagram representing part of a receiver according to an embodiment of the present invention.

Referring first to FIG. 2, a multi-band receiver front end is shown generally at 50. The receiver 50 of FIG. 2 has some of the same components as the receiver 10 of FIG. 1, and thus those components that are common to both receivers 50, 10 are denoted in FIG. 2 by the same reference numerals used in FIG. 1.

As in the receiver 10 of FIG. 1, the receiver 50 shown in FIG. 2 has a multi-resonant antenna 12 which is able to receive signals in multiple (e.g. 3) different frequency ranges, although the present invention is equally applicable to receivers having a plurality of separate antennae, e.g. one antenna for each frequency range that can be received by the receiver. The receiver 50 also has parallel low noise amplifiers (LNAs) 20, 22, 24, which may be implemented in an integrated circuit (chip), shown generally at 52 in FIG. 2.

Each of the LNAs 20, 22, 24 is configured to operate in one of the frequency ranges of the antenna 12, and has an input which is connected to a one of a plurality of receive paths 54, 56, 58, which in turn are connected to the output of the antenna 12. The receive paths 54, 56, 58 are described in detail below. In the example illustrated in FIG. 2, the receiver 50 can only receive signals in a single frequency range at a time. However, it will be appreciated that the principles of the present invention are equally applicable to receivers which can receive signals in two or more frequency ranges simultaneously.

The outputs of the LNAs 20, 22, 24 are fed to an input of a common buffer 26, via a common output resonator circuit made up of a variable capacitor 28 and an inductor 30 connected in parallel between a supply voltage and the input of the buffer 26. The common output resonator circuit can be tuned using the variable capacitor 28 to select its centre frequency.

As is explained above, the output of the antenna 12 is connected to parallel first, second and third receive paths 54, 56, 58, which are each connected to the input of one of the on-chip LNAs 20, 22, 24. Each of the receive paths 54, 56, 58 includes several passive components. Where the LNAs 20, 22, 24 are implemented in a chip 52, some or all of the passive components may be provided on the chip 52.

The first receive path 54 in this example includes a first inductor 60 and a second inductor 62, which in this example are both external to the chip 52. The first inductor 60 has an input terminal which is connected to the output of the antenna 12, and an output which is connected to an input of the second inductor 62, an output of which is connected to ground. The output of the first inductor 60 is also connected to an input of a first capacitor 64 and to an input of a second capacitor 66 (which in this example is a variable capacitor), an output of which is connected to ground. Thus, the first inductor 60 and the first capacitor 64 form a series resonant network (i.e. a series LC filter), whilst the second inductor 62 and the second capacitor 66 form a parallel resonant network (i.e. a parallel LC filter) whose resonant frequency can be adjusted by adjusting the capacitance of the variable capacitor 66 to tune the first receive path 54 to a desired frequency range.

It is to be understood that the resonant circuit made up of the second inductor 62 and the second capacitor 66 shown in FIG. 2 is merely one example of a possible resonant circuit. In practice the composition of the resonant circuit required for tuning of the first receive path 54 (and the second and third receive paths 56, 58) will be dependent on a number of factors including the desired frequency range of the receive path 54 (56, 58), the input impedance of the LNA 20 (22, 24) and the output impedance of the antenna 12. Typically the resonant circuit will be made up only of one or more inductors and one or more capacitors. However regardless of the composition of the resonant circuit, it should present a high impedance at the pass-bands of the input resonant circuits of the other receive paths.

The output of the first capacitor 64 is connected to an input of a coupling capacitor 68, which couples the output of the first capacitor 64 to the input of the LNA 20.

A switch 70, which may be a transistor for example, is connected between ground and the node formed between the output of the coupling capacitor 68 and the input of the LNA 20 such that when the switch 70 is closed the first receive path 54 terminates at ground rather than at the LNA 20, as is explained in more detail below.

The second and third receive paths 56, 58 take the same form as the first receive path 54. Thus, the second receive path 56 has a series resonant network formed by a first inductor 80 and a first capacitor 84 and a parallel resonant network formed by a second inductor 82 and a second capacitor 86, which in this example is a variable capacitor. The output of the first capacitor 84 is connected to the input of a coupling capacitor 88 which couples the output of the first capacitor 84 to the input of the LNA 22. A switch 90, which may be a transistor for example, is connected between the output of the coupling capacitor 88 and ground such that when the switch 90 is closed the second receive path 56 terminates at ground rather than at the LNA 22, as is explained in more detail below.

Similarly, the third receive path 58 has a series resonant network formed by a first inductor 100 and a first capacitor 104 and a parallel resonant network formed by a second inductor 102 and a second capacitor 106, which in this example is a variable capacitor. The output of the first capacitor 104 is connected to the input of a coupling capacitor 108 which couples the output of the first capacitor 104 to the input of the LNA 24. A switch 110, which may be a transistor for example, is connected between the output of the coupling capacitor 108 and ground such that when the switch 112 is closed the third receive path 58 terminates at ground rather than at the LNA 24, as is explained in more detail below.

The first, second and third receive paths 54, 56, 58 are each tuned to pass signals in one of the particular discrete frequency ranges that can be received by the antenna 12, and to attenuate signals in other frequency ranges that can be received by the antenna 12. For example, the antenna 12 may be able to receive signals in the 850 MHz, 900 MHz, 1800 MHz, 1900 MHz and 2.4 GHz standardised frequency bands (which are defined in terms of frequency ranges, for example the GSM900 frequency band operates in the frequency range 890-960 MHz).

Thus, the first receive path 54 may be tuned, by selection of the values of the first inductor 60 and the first capacitor 64, to pass signals in a first frequency band $f_1$ by providing a low impedance path from the antenna 12 to the input of the LNA 20 whilst presenting a high impedance path to signals outside the first frequency band $f_1$, which may be, for example, the GSM900 frequency band.

The second receive path 56 may be tuned, by selection of the values of the first inductor 80 and the first capacitor 84, to pass signals in a second frequency band $f_2$ by providing a low impedance path from the antenna 12 to the input of the LNA 22 whilst presenting a high impedance path to signals outside the second frequency band $f_2$, which may be, for example, the GSM 1800 frequency band.

Similarly, the third receive band 58 may be tuned, by selection of the values of the first inductor 100 and the first capacitor 104 to pass signals in a third frequency band $f_3$ by providing a low impedance path from the antenna 12 to the input of the LNA 24 whilst presenting a high impedance path to signals outside the third frequency band $f_3$, which may be, for example, the 2.4 GHz frequency band.

The first receive path 54 includes a first power detector 112, which has an input which is connected to the output of the coupling capacitor 68, and is configured to monitor the power level of a signal present in the first receive path 54. Similarly, the second receive path 56 includes a second power detector 114 whose input is connected to the output of the coupling capacitor 88 for monitoring the power level of a signal present in the second receive path 56, whilst the third receive path 58 includes a third power detector 116 whose input is connected to the output of the coupling capacitor 108 for monitoring the power level of a signal which is present in the third receive path 56.

The first, second and third power detectors 112, 114, 116 have outputs which are connected to inputs of an overload controller 118, which has outputs which control the operation of the switches 70, 90, 110.

The overload controller 118 receives signals from the first, second and third power detectors 112, 114, 116, and to cause the switches 70, 90, 110 of the corresponding receive paths 54, 56, 58 to close in the event that the power of a signal input to the receiver 50 is of a magnitude that could damage one or more of the LNAs 20, 22, 24 (i.e. an overload condition), thereby providing a direct path to ground for such received signals so that they do not reach the LNAs 20, 22, 24, and deactivating the corresponding receive paths 54, 56, 58.

The overload controller 118 can also deactivate, and therefore protect, unused receive paths 54, 56, 58, by commanding their respective switches 70, 90, 110 to close when the receive paths 54, 56, 58 are not in use. Additionally, in the event of an overload condition in a receive path 54, 56, 58 that is in use, the overload controller 118 can, as well as deactivating the overloaded receive path 54, 56, 58, activate an unused path to allow part of the overloading signal to be received by the unused receive path 54, 56, 58, which may allow useful information to be obtained from the overloading signal without risking damage to the LNAs 20, 22, 24.

The overload controller 118 is also able to receive commands from a higher level controller such as a mobile telephone controller on a difference die of an integrated circuit in which the receiver 50 is implemented, or from a transmitter on the same die as the receiver 50. Such commands may be issued, for example, when a high power transmission is to be made by the mobile telephone transmitter, to cause the overload controller 118 to protect the LNAs 20, 22, 24 by deactivating one or more of the receive paths 54, 56, 58.

Thus, the power detectors 112, 114, 116, the overload controller 118 and the switches 70, 90, 110 constitute an input protection system for the LNAs 20, 22, 24.

In normal operation of a device such as a mobile telephone incorporating the receiver 50, the device determines which of the receive paths 54, 56, 58 is to be active, depending on the frequency band of a signal to be received. The selected receive path 54, 56, 58 is activated by opening the relevant switch 70, 90, 110, whilst the switches 70, 90, 110 of the inactive receive paths 54, 56, 58 are closed, thereby deactivating them by providing a path to ground for received signals in the frequency bands of the inactive receive paths 54, 56, 58, thus protecting the LNAs 20, 22, 24 of the inactive receive paths 54, 56, 58 from potentially damaging high power signals.

The power detector 112, 114, 116 and the overload controller 118 protect the LNA 20, 22, 24 of the active receive path 54, 56, 58, by detecting the power of signals received by the active receive path 54, 56, 58 and closing the switch 70, 90, 110 of the receive path 54, 56, 58 if the power of the received signal is of a magnitude that could damage the LNA 20, 22, 24, as described above.

It will be appreciated that the LNAs 20, 22, 24 must be protected even when the receiver 50 is not active, as high power in-band signals may still be received by the antenna 12 and transmitted to the LNAs 20, 22, 24 via the receive paths 52, 54, 56 in such circumstances. Thus, the switches 70, 90, 110 must default to their closed position, thereby short-circuiting the receive paths 52, 54, 56 so that potentially damaging received signals in the frequency bands to which the receive paths 52, 54, 56 are tuned do not reach the LNAs 20, 22, 24.

In one embodiment, the switches 70, 90, 110 are provided with a power supply which is always on, even when the receiver 50 is inactive. In this embodiment, the switches 70, 90, 110 are biased to their closed position when a power supply is present, and open only when commanded to do so by a control signal from the overload controller 118. Thus, in the absence of such a control signal from the overload controller 118 when a power supply is present the switches 70, 90, 110 are held in their closed position and the LNAs 20, 22, 24 are protected from potentially damaging received signals. Alternatively, the switches 70, 90, 110 may be biased to their closed position when no power supply is present, such that the receive paths 54, 56, 58 are deactivated by default when there is no power supply or when the power supply is removed, thus protecting the LNAs 20, 22, 24.

In another embodiment, the power detectors 112, 114, 116 act as a power supply to the switches 70, 90, 110, such that in the event of an overload condition in one of the receive paths 54, 56, 58 (i.e. an input signal has a power level which could damage the LNA 20, 22, 24 of the receive path 54, 56, 58) the switch 70, 90, 110 of the receive path 54, 56, 58 in which the overload condition is detected receives a power supply which causes it to revert to its default closed position, thereby providing a path directly to ground for the high power received signal, thus preventing the signal from reaching the LNA 20, 22, 24.

Figure 3:
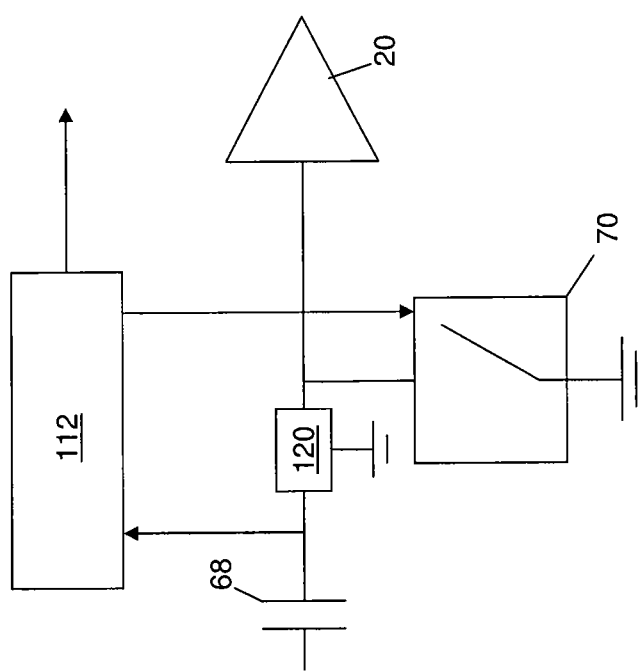
FIG. 3 is a schematic diagram illustrating part of a system for protecting LNAs of the receiver of FIG. 2.

This arrangement is illustrated in FIG. 3, which is a schematic view of part of the first receive path 54 including the first power detector 112, the first LNA 20 and the switch 70. It will be appreciated that the same arrangement can be used for the other receive paths 56, 58. In the arrangement of FIG. 3 the first power detector 112 has an output which is connected to an input of the overload controller 118. A further output of the first power detector is used as a power supply to the switch 70. In the event that a signal having a power level which could damage the LNA 20 is received by the first receive path 54, the first power detector 112 outputs a signal to the overload controller 118 and to the switch 70. The first power detector 112 responds quickly enough to the high power input signal to provide an output signal to power the switch 70, which immediately assumes its default closed position, thereby protecting the LNA 20 by preventing the received signal from reaching it.

It will be appreciated that a rapid drop in the power level detected by the first power detector 112 would cause the first power detector 112 to cease outputting a signal to the switch 70, which may in turn assume its open position, allowing the received input signal to reach the LNA 20. In this case, the power level of the received signal may ramp up to a damaging level again before the first power detector 112 is able to respond by providing a signal to act as a power supply to the switch 70, and thus the LNA 20 may be damaged.

To alleviate this problem, in the arrangement of FIG. 3 an additional impedance 120 is provided in series between the coupling capacitor 68 and the input of the first LNA 20. This additional impedance 120 may be, for example, a capacitor, and its purpose is to prevent the voltage detected by the first power detector 112 from dropping excessively when the switch 70 closes, thereby ensuring that the first power detector 112 continues to provide an output to act as a power supply to the switch 70 until the power of the received signal has dropped to a safe level, thereby ensuring that the LNA 20 remains protected.

The receiver 50 illustrated in FIG. 2 includes a low IF or zero IF receiver 122, an input tuning calibration controller 124, a processor 126, an output tuning calibration controller 128, an oscillator 130 and a fourth power detector 132. These components are used for calibrating the receive paths 54, 56, 58 and the output resonator formed by the capacitor 28 and the inductor 30, as will be described below.

On an integrated circuit die the values of inductors and capacitors are typically not very accurate, specifically not accurate enough to allow the use of the narrowest possible bandwidths. In order to receive signals in the frequency bands of interest, the receive paths 54, 56, 58 must be tuned or calibrated by adjusting the second (variable) capacitors 66, 86, 106 of the first, second and third receive paths 54, 56, 58. This is achieved using the low IF or zero IF receiver 122, whose operation is controlled by the input tuning calibration controller 124. Additionally, this tuning or calibration process is required so that the power detectors 112, 114, 116 will be most sensitive in the frequency ranges of interest and not elsewhere.

Figure 4:
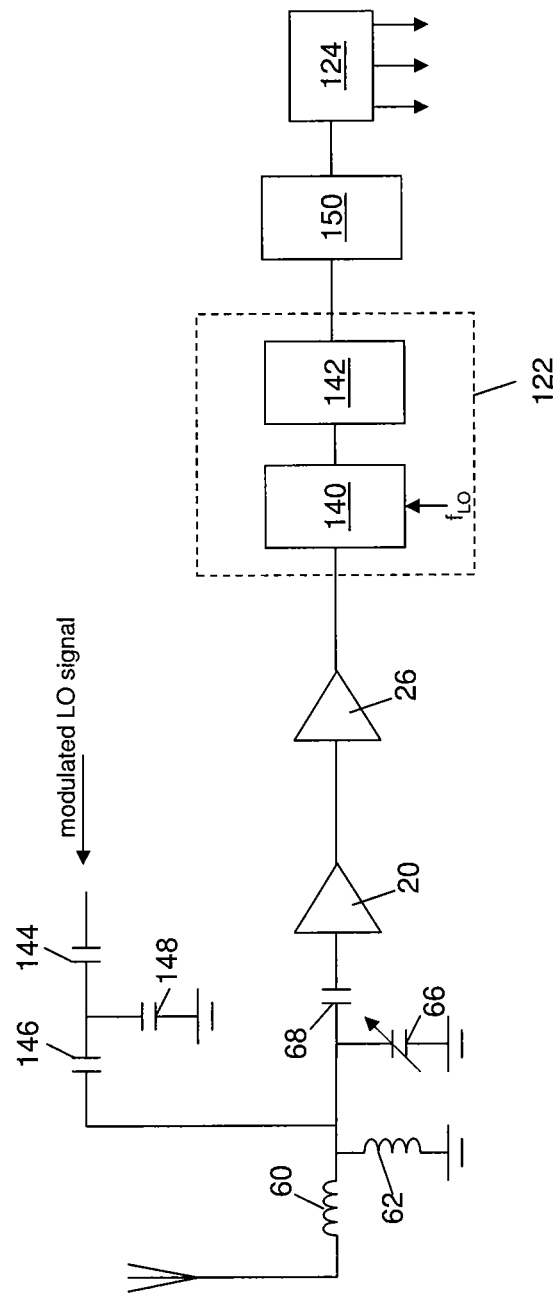
FIG. 4 is a schematic diagram illustrating a system used to calibrate receive paths of the receiver of FIG. 2.

FIG. 4 is a schematic representation of the components of the receiver 50 which are used in the calibration or tuning of the first receive path 54. The low or zero IF receiver 22 includes a mixer 140 which receives a signal from a local oscillator at a frequency $f_{LO}$, which is at or close to the desired centre frequency of the first receive path, and outputs a mixed signal composed of the output of the buffer 26 and the local oscillator signal to an analogue to digital converter (ADC) 142.

A low-power sample of the local oscillator signal is modulated using a BPSK modulation scheme and applied to the input of the LNA 20 via a capacitor network made up of capacitors 144, 146, 148, which are used for two purposes. One is to attenuate greatly the tuning calibration signal to minimise leakage of the BPSK modulated signal through the antenna 12, and the other is to minimise the change of tuning frequency from the inductors 60, 62 and the capacitor 66 due to the presence of the calibration signal generator and any changes in source impedance from it.

The BPSK modulated signal is amplified by the LNA 20 and the buffer 26 before being mixed with the local oscillator signal in the mixer 140. The analogue mixed signal is converted into a digital signal by the ADC 142, and this digital signal is passed to a detector 150 which is configured to report the detected signal level to the input tuning calibration controller 124. The input tuning calibration controller 124 analyses the signal received from the detector 150 to detect a maximum in the digitised mixed signal. The input tuning calibration controller 124 is configured to detect a maximum in the digitised mixed signal for a received BPSK signal at 1.5 MHz. If such a maximum is not detected the input tuning calibration controller 124 adjusts the value of the second (variable) capacitor 66 of the first receive path 54. This process repeats until the maximum is detected by the detector 150, at which point the first receive path 54 is calibrated and the calibration value of the second capacitor 66 is stored by the processor 126.

The second and third receive paths 56, 58 are calibrated in the same way, by adjusting the local oscillator frequency to a frequency at or close to the desired centre frequency of the second or third receive path 56, 58 and applying a BPSK modulated sample of the local oscillator signal to the appropriate LNA 22, 24. The output of the LNA 22, 24 is amplified by the buffer 26, whose output is mixed with the local oscillator signal and digitised by the mixer 140 and ADC 142 respectively. The detector 150 then seeks a maximum in the digitised mixed signal and outputs a control signal to the to the input tuning calibration controller 124 indicating that the value of the second (variable) capacitor 86, 106 of the second or third receive path 56, 58 should be adjusted. This process repeats until the maximum is detected by the detector 150, at which point the second or third receive path 56, 58 is calibrated and the calibration value of the second capacitor 86, 106 is stored by the processor 126.

It will be appreciated from the description above that the low or zero IF receiver 122, the detector 150 and the input tuning calibration controller 124 enable automatic tuning of the receive paths 54, 56, 58 of the receiver 50.

In an alternative embodiment the low power sample of the local oscillator signal may be amplitude modulated, in which case the detector 150 seeks a maximum in the amplitude of the digitised mixed signal output by the ADC 142.

In a further alternative embodiment the low power sample of the local oscillator signal may be square wave frequency modulated. In this embodiment the transient response of the receiver 50 is analysed by the detector 150 to detect when the receive path is calibrated by comparing the amplitude of positive and negative peaks in the transient response of the receiver 50.

In the examples described above the a sample of the signal generated by the local oscillator is modulated to generate a signal used in calibrating the receive paths. However, it will be appreciated that unmodulated signals can also be used in the calibration process; indeed, any signal that can be received by the receive path can be used in the calibration process.

In a further alternative embodiment, a low power signal at the centre frequency of the desired frequency band of the input path 54, 56, 58 is transmitted to the receiver 50. The value of the second (variable) capacitor 66, 86, 106 of the appropriate receive path 54, 56, 58 is adjusted to maximise the received signal in the appropriate receive path 54, 56, 58.

The output resonator circuit made up of the capacitor 28 and the inductor 30 must also be tuned or calibrated for each of the receive paths 54, 56, 58. Calibration of the output resonator uses the output tuning calibration controller 128, an oscillator 130 and a fourth power detector 132, as will be described below.

The output resonator circuit can be calibrated in the same way as the receive paths 54, 56, 58 as described above, in which case the oscillator 130 provides the local oscillator signal. It will be appreciated that the output resonator circuit must be calibrated for each of the receive paths 54, 56, 58. Thus, the output resonator is first calibrated for the first input path 54 and the calibration value of the capacitor 28 is stored by the processor 126. The process is repeated for the second and third receive paths 56, 58 and the calibration values of the capacitor 28 for the second and third receive paths 56, 58 are stored by the processor 126. In this way the appropriate value of the capacitor 28 can be retrieved from the processor 126 and applied depending on the receive path that is in use.

In an alternative embodiment, the output resonator circuit can be calibrated by creating an oscillator out of the capacitor 28 and the inductor 30. This technique is described in detail in US patent application no. US2009/0325521 of 22 Dec. 2008, but essentially involves dividing and measuring the frequency of the signal produced by the oscillator formed by the capacitor 28 and the inductor 30 using a frequency counter and adjusting the value of the capacitor 28 or/and the inductor 30 until the frequency of the signal produced by the oscillator is as close as possible to the desired centre frequency of the output resonator.

The output resonator formed by the capacitor 28 and the inductor 30 is associated with the fourth power detector 132, which is configured to monitor the power of signals output by the LNAs 20, 24, 26 and to output a control signal to the overload controller 118 if the power output by an LNA 20, 22, 24 is at a potentially damaging level (i.e. an overload condition) such that the switch 70, 90, 110 of the appropriate receive path 54, 56, 58 can be closed to protect the LNA 20, 22, 24.

In operation of the receiver 50, the first, second and third power detectors 112, 114, 116 are always on, regardless of the calibration state of the receive paths 54, 56, 48 and the output resonator circuit and regardless of whether the processor 126, the input tuning calibration controller 124 or the output tuning calibration controller 128 are active or powered up. This ensures that the LNAs 20, 22, 24 are protected at all times.

When power is applied to the receiver 50, the output resonator circuit is calibrated before the receive paths 54, 56, 58. This is necessary as the calibration of the output resonator circuit affects the calibration of the receive paths, since the output resonator circuit is used in the receive path calibration process, and thus any error in the calibration of the output resonator circuit could lead to calibration errors in the receive paths 54, 56, 58.

If an overload condition is present in any of the receive paths 54, 56, 58 then calibration of the output resonator circuit cannot commence, as overload in a receive path could prevent accurate calibration of the output resonator circuit.

Provided that no overload condition is present in any of the receive paths 54, 56, 58, the output resonator circuit is calibrated for each of the receive paths 54, 56, 58 in sequence, with the calibration values of the capacitor 58 for each receive path 54, 56, 58 being stored by the processor 126. Once this process has been completed each of the receive paths 54, 56, 58 is calibrated in turn, with the calibration values of the second capacitors 66, 86, 106 being stored by the processor 126.

It will be appreciated that the receiver 50 of the present invention obviates the need for costly SAW filters in the input of a multi-band receiver, whilst providing protection for the LNAs of the receiver and accurate tuning and calibration of each receive band.

The invention claimed is:

1. A receiver comprising:
    an antenna for receiving signals in a plurality of frequency ranges;
    a plurality of amplifiers, each of the plurality of amplifiers being configured to amplify signals in one of the plurality of frequency ranges;
    a plurality of receive paths, each of the plurality of receive paths connecting an output of the antenna to an input of one of the plurality of amplifiers, wherein
    each of the plurality of receive paths includes a power detector for monitoring signal power in the receive path and a switch which can be operated to activate or deactivate the receive path, wherein the switch of each receive path is operable to deactivate the receive path if an overload condition is detected by the power detector of that receive path;
    wherein the switch of each of the plurality of receive paths is biased towards a position in which the receive path is deactivated when a power supply is provided to the switch; and
    wherein the power detector of each of the plurality of receive paths has an output which is connected to a power supply input of the switch of that receive path such that if an overload condition is detected by the power detector the switch receives a power supply to cause it to revert to its bias position and deactivate the receive path.

2. The receiver according to claim 1 wherein each of the plurality of receive paths includes a resonant circuit for filtering signals received at the antenna.

3. The receiver according to claim 2 wherein the resonant circuit of each of the plurality of receive paths contains only one or more inductors and one or more capacitors.

4. The receiver according to claim 1 further comprising a resonant circuit for filtering the outputs of the amplifiers.

5. The receiver according to claim 4 further comprising means for tuning the resonant circuit for filtering the output of the amplifiers.

6. The receiver according to claim 1 wherein the switch of each of the plurality of receive paths is provided with a power supply which is always on.

7. The receiver according to claim 1 wherein each of the plurality of receive paths comprises an impedance to ensure that the switch remains in its bias position and the receive path remains deactivated until the overload condition ceases.

8. The receiver according to claim 1 wherein the switch of each of the plurality of receive paths is biased towards a position in which the receive path is deactivated when no power supply is provided to the switch.

9. The receiver according to claim 1 wherein the switch of each of the plurality of receive paths is operable to deactivate that receive path when that receive path is not in use.

10. The receiver according to claim 1 further comprising an overload controller which is configured to receive an input from the power detector of each of the plurality of receive paths and to control the operation of the switch of each of the plurality of receive paths according to the inputs received from the power detectors.

11. The receiver according to claim 1 further comprising means for tuning each of the plurality of receive paths to a desired frequency range.

12. The receiver according to claim 11 wherein the means for tuning each of the plurality of receive paths comprises means for detecting a maximum in a signal received by the receiver and a controller for adjusting the resonant circuit of the receive path to adjust the tuning of the receive path.

13. The receiver according to claim 12 further comprising a signal source which generates a signal which can be used by the receiver for purposes of tuning adjustment.

14. The receiver according to claim 13 wherein the signal is modulated with BPSK, AM or square wave FM.

15. A receiver comprising:
   an antenna for receiving signals in a plurality of frequency ranges;
   a plurality of amplifiers, each of the plurality of amplifiers being configured to amplify signals in one of the plurality of frequency ranges;
   a plurality of receive paths, each of the plurality of receive paths connecting an output of the antenna to an input of one of the plurality of amplifiers; and
   means for tuning each of the plurality of receive paths to a desired frequency range;
   wherein each of the plurality of receive paths includes a power detector for monitoring signal power in the receive path and a switch which can be operated to activate or deactivate the receive path, wherein the switch of each receive path is operable to deactivate the receive path if an overload condition is detected by the power detector of that receive path; and
   wherein the means for tuning each of the plurality of receive paths comprises means for detecting a maximum in a signal received by the receiver and a controller for adjusting the resonant circuit of the receive path to adjust the tuning of the receive path.

16. The receiver according to claim 15 further comprising a signal source which generates a signal which can be used by the receiver for purposes of tuning adjustment.

17. The receiver according to claim 16 wherein the signal is modulated with BPSK, AM or square wave FM.

* * * * *

UNITED STATES PATENT AND TRADEMARK OFFICE
CERTIFICATE OF CORRECTION

PATENT NO. : 8,699,977 B2  Page 1 of 1
APPLICATION NO. : 13/423648
DATED : April 15, 2014
INVENTOR(S) : Babitch et al.

It is certified that error appears in the above-identified patent and that said Letters Patent is hereby corrected as shown below:

In the Specification

In Column 8, Line 64, delete "the a sample" and insert -- the sample --, therefor.

Signed and Sealed this
Ninth Day of September, 2014

Michelle K. Lee
*Deputy Director of the United States Patent and Trademark Office*